United States Patent

Hathaway et al.

[11] Patent Number: 5,600,239
[45] Date of Patent: Feb. 4, 1997

[54] STRAIN SENSING SYSTEM INCLUDING A MAGNETOSTRICTIVE MATERIAL HAVING A PIEZOMAGNETIC PROPERTY SELECTED FOR MAXIMIZING ELECTRICAL IMPEDANCE TO CURRENT APPLIED TO A PREDETERMINED SKIN DEPTH

[75] Inventors: Kristl B. Hathaway, Deale; James B. Restorff, College Park; Marilyn Wun-Fogle, Gaithersburg; Arthur E. Clark, Adelphia, all of Md.

[73] Assignee: The United States of America as represented by the Secretary of the Navy, Washington, D.C.

[21] Appl. No.: 611,469

[22] Filed: Jun. 16, 1995

[51] Int. Cl.$^6$ .............................. G01R 33/18; G01L 3/02
[52] U.S. Cl. ........................... 324/209; 73/862.338
[58] Field of Search ................ 73/862.338, 862.045, 73/862.474, 862.333, 862.69, 779; 324/209, 207.13

[56] References Cited

U.S. PATENT DOCUMENTS

| | | | |
|---|---|---|---|
| 3,214,688 | 10/1965 | Drexler et al. | 324/209 |
| 3,745,448 | 7/1973 | Hiratsuka et al. | 324/209 |
| 3,782,187 | 1/1974 | Dahle | 73/862.69 |
| 4,894,579 | 1/1990 | Higuchi et al. | 310/328 |
| 4,931,729 | 6/1990 | Pratt | 324/209 |
| 5,142,227 | 8/1992 | Fish | 324/209 |
| 5,168,760 | 12/1992 | Wun-Fogle et al. | 73/779 |

*Primary Examiner*—Sandra L. O'Shea
*Assistant Examiner*—Roger Phillips
*Attorney, Agent, or Firm*—John Forrest; Jacob Shuster

[57] ABSTRACT

A magnetostrictive element having a large magnetomechanical coupling factor along its axis, is selected to determine strain by measurement of changes in its electrical impedance along such axis. Such measurement is maximized by generation of current of a predetermined frequency conducted through the magnetostrictive element to correspondingly penetrate the magnetostrictive element to a substantial skin depth.

8 Claims, 2 Drawing Sheets

4,600,239

STRAIN SENSING SYSTEM INCLUDING A MAGNETOSTRICTIVE MATERIAL HAVING A PIEZOMAGNETIC PROPERTY SELECTED FOR MAXIMIZING ELECTRICAL IMPEDANCE TO CURRENT APPLIED TO A PREDETERMINED SKIN DEPTH

BACKGROUND OF THE INVENTION

The present invention relates generally to the sensing and measurement of strain.

The sensing of strain by measuring changes in electrical impedance of a magnetostrictive body of material under stress, to which a magnetic field is applied, is generally known in the art as disclosed in U.S. Pat. Nos. 3,745,448, 4,500,864, 5,142,227 and 5,168,760 to Hiratsuk, Nakaue et al., Fish and Wun-Fogle et al., respectively. According to the Fish patent, the magnetostrictive body of material in the form of a wire, ribbon or thin film is subjected to strain measured as changes in electrical resistance. According to the Wun-Fogle et al. patent, the electrical resistance of ferromagnetic material subjected to a magnetic field, is measured in order to provide data to a strain indicator. Such prior art strain sensing and gauging systems are often limited as to application, and are relatively costly because of data processing necessary in connection therewith.

It is therefore an important object of the present invention to provide a system for sensing strain in a wide variety of applications by measurement of the impedance of a relatively small magnetostrictive body of material such as wire, ribbon, film or the like, with a high degree of sensitivity so as to enhance determination of strain in a less costly manner.

SUMMARY OF THE INVENTION

In accordance with the present invention a relatively small body of ferromagnetic material having piezomagnetic properties is attached to a surface of some structure to be monitored for strain. Piezomagnetic properties refers to the effect of variations in magnetic susceptibility and remanent magnetism as a function of stress applied to ferromagnetic material, according to established physics dictionary publications. The availability of such ferromagnetic materials is disclosed for example in U.S. Pat. Nos. 4,763,030 and 5,347,872 to Clark et al. It is also known that such materials exhibit a very high magnetomechanical coupling factor (k) of 0.9.

Pursuant to the present invention stress is transferred from the structure being monitored to the foregoing type of ferromagnetic material acting as a magnetostrictive element while subjected to a current generated at a predetermined frequency at which the current penetrates the material to a certain degree. The degree to which a sheet or wire made of such the material is penetrated by the current is characterized as a ratio of penetration skin depth to thickness for the sheet or radial distance from an axis along which the wire is energized by the current. When so penetrated by the current, the magnetostrictive element experiences a maximized change in electric impedance along its axis during strain, where the ferromagnetic material selected exhibits a large magnetomechanical coupling factor. Impedance measurements along the axis of the selected magnetostrictive material will accordingly enhance processing of the data so obtained into a stress or strain indicating readout under the conditions of the present invention.

BRIEF DESCRIPTION OF THE DRAWING FIGURES

A more complete appreciation of the invention and many of its attendent advantages will be readily appreciated as the same becomes beuer understood by reference to the following detailed description when considered in correction with the accompanying drawings wherein.

DETAILED DESCRIPTION OF PREFERRED EMBODIMENTS

Figure 1:
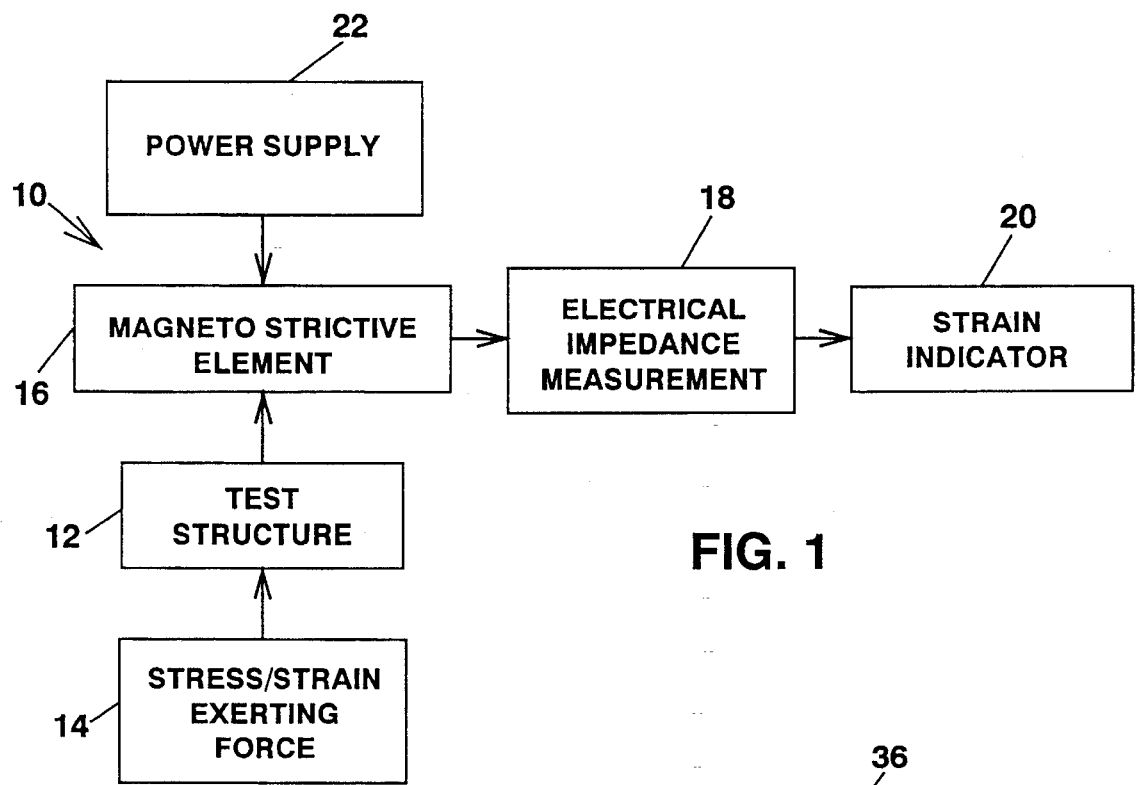
FIG. 1 is a block diagram depicting the strain sensing system of the present invention.

Referring now to the drawing in detail, FIG. 1 diagrams a strain gauge system, generally referred to by reference numeral 10 wherein some test structure 12 to be monitored has a stress/strain force 14 applied thereto. Such force is transferred to a magnetostrictive element 16 subjected to measurement of its electrical impedance as denoted by 18 in FIG. 1, in order to determine strain of the test structure 12 by data processing of the impedance measurements through the strain indicator 20. The impedance measurement 18 is perforated on the magnetostrictive element 16 while under the influence of a power supply 22 from which electrical current is applied.

Figure 2:
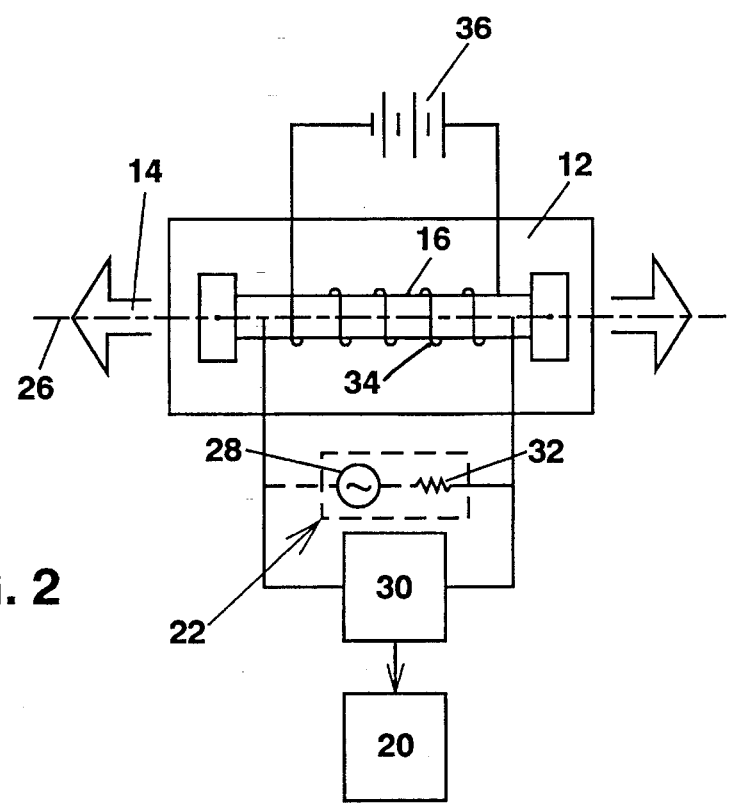
FIG. 2 is a schematic circuit diagram of the system depicted in FIG. 1 pursuant to one embodiment of the invention.
Figure 3:
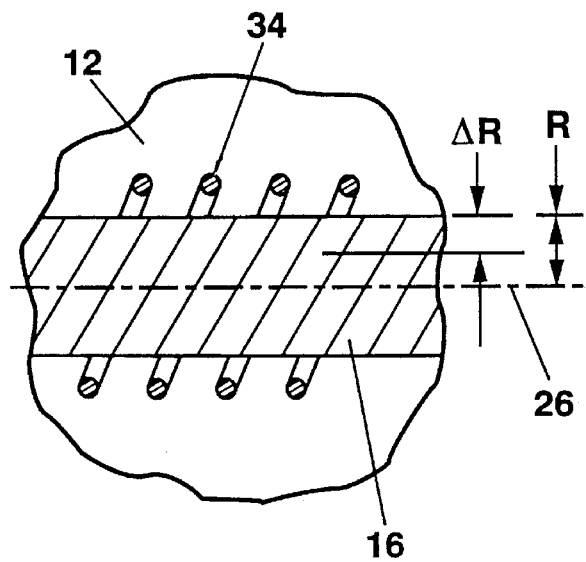
FIG. 3 is an enlarged partial side section view of a portion of the apparatus associated with the system depicted in FIG. 2.
Figure 4:
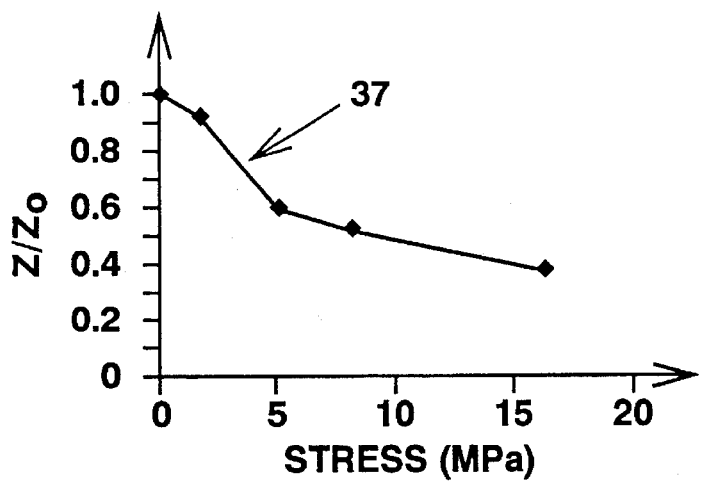
FIGS. 4 and 5 are graphs of depicting certain characteristics associated with the system diagrammed in FIGS. 1–3.

According to the embodiment depicted in FIGS. 2 and 3, the magnetostrictive element 16 is in the form of a cylindrical wire having a radius (R) relative to its axis 26. The magnetostrictive element could alternatively be a thin film sheet or ribbon of either rectangular or elliptical cross-section. The element 16 is fastened at its opposite ends to a substrate surface of test structure 12 through which the stress imparting force 14 is applied along axis 26. An AC source of current of a frequency (f) is fed by supply 22 to the wire element 16 so as to conduct such current along axis 26. A DC bias is optionally applied to the Wire element 16 through a magnetic field generating coil 34 connected to a DC voltage source 36. The DC magnetic field so applied to element 16 establishes an operating point for measurement purposes. The measurement of impedance (Z) of element 16 along its axis 26 is effected by an impedance measuring device 50 to which strain indicator 20 is connected as diagrammed in FIG. 2. The element 16 as well as the impedance measuring device 30 are accordingly connected to tile power supply 22 in the form an AC source 28 in series with resistor 32 as also diagrammed in FIG. 2. It is generally known in the art that current at a high frequency (f) supplied to an electrically, conductive wire element is limited to travel along its outer surface penetrated by the current to a skin depth ($\delta$), in accordance with the formula: $\delta = \sqrt{1/2\pi f \sigma \mu}$, where $\sigma$ is conductivity and $\mu$ is magnetic permeability of the wire element. When stress or strain is applied to such a magnetostrictive element, its magnetic properties such as ($\mu$) are modified by the magnetoelastic effect to alter the skin depth ($\delta$) and change its electrical impedance (Z). Based on actual measurements made on thin wire elements, where the magnetic field is zero (H=0), the dependency of its impedance (Zo) on stress applied was demonstrated as reflected by curve 37 in FIG. 4. Even greater stress sensitivity is accordingly expected where the magnetic field is maximized at some value (Hc).

Figure 5:
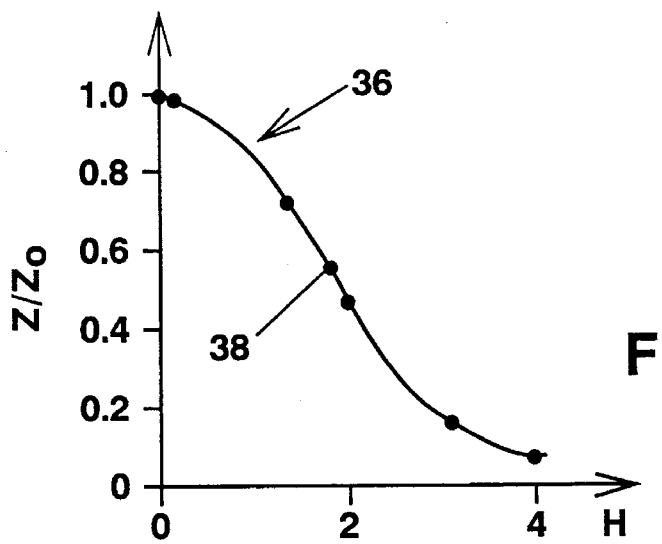

As graphically diagrammed in FIG. 5 the impedance ratio Z/Zo of the wire element 16 of radius (R) will vary as a function of its penetration by the magnetic field (H) to a skin depth ($\Delta R$) as an appreciable fraction of the radius (R) in accordance with the giant magneto-impedance effect as shown by curve 36. At a predetermined point 38 on curve 36 in the region of the maximized magnetic field (He), corresponding to a predetermined penetration skin depth ratio ($\Delta R/R$), the change in impedance is maximized. As shown in FIG. 3, the skin depth ($\Delta R$) is a radial distance perpendicular to the axis 26 of the wire element 16 along which current is conducted the magnetic field polarized and impedance is measured.

Pursuant to the present invention, change in impedance (Z) is maximized under the conditions hereinbefore described by selecting a ferromagnetic material with piezomagnetic properties for the wire element 16 having a large piezon agnetic constant parallel to the magnetic polarization axis 26. One example of such a material is commercial amorphous $Fe_{81}B_{13.5}Si_{3.5}C_2$. The increased change in impedance resulting from use of such type of material for the element 16 will render measurement of impedance more sensitive to changes in stress applied in a wide varied, of applications ranging in size between strain gauging sensors of microscopic parts and large scale sensors of meter dimensions. The determination of strain by processing of such impedance measurement data through the strain indicator 20 is accordingly, enhanced.

Obviously, other modifications and variations of the present invention may be possible in light of the foregoing teachings. It is therefore to be understood that within the scope of the appended claims the invention may be practiced otherwise the as specifically described.

What is claimed is:

1. A method of enhancing determination of strain of a magnetostrictive element produced by stress exerted thereon during supply of current thereto, including the steps of: applying said current to the magnetostrictive element for penetration thereof to predetermined skin depth ratio; selecting a piezomagnetic material for the magnetostrictive element having a large magnetomechanical coupling factor maximizing change in impedance in response to said strain of the magnetostrictive material during said penetration by the current to said predetermined skin depth ratio; and measuring said maximized change in impedance.

2. The method as defined in claim 1 wherein said step of measuring the maximized change in impedance is effected by measurement along said axis of the magnetostrictive element.

3. The method as defined in claim 2 herein said step of applying the current includes supply thereof at a frequency corresponding to said penetration of the magnetostrictive element to said predetermined skin depth.

4. The method as defined in claim 3 wherein said step of applying the current includes supply thereof at a frequency corresponding to said penetration of the magnetostrictive element to said predetermined skin depth.

5. In a gauge for determining strain of a substrate to which a magnetostrictive element is attached, by measuring changes in impedance of the magnetostrictive element along an axis thereof caused by said strain, means for generating a current at a predetermined frequency; and means for applying said current to the magnetostrictive element; said magnetostrictive element being made of a material maximizing the changes in impedance being measured along said axis.

6. The combination as defined in claim 5 wherein the changes in the impedance of the magnetostrictive element is maximized during penetration thereof by the current at said predetermined frequency to a substantial skin depth distance perpendicular to said axis.

7. A method for enhancing determination of strain from a measurement of electrical impedance along an axis of a magnetostrictive element to which stress is applied, comprising the steps of: selecting a material for the magnetostrictive element which maximizes changes in the electrical impedance and has a large sensitivity constant parallel to said axis; generating an electrical current having a frequency corresponding to penetration of the magnetostrictive element to a predetermined depth; and applying the current to the magnetostrictive element for measuring the electrical impedance thereof.

8. A method for enhancing change in electrical impedance of a magnetostrictive element as a result of stress applied thereto, said magnetostrictive element having a longitudinal axis and, comprising the steps of: applying an AC current to the magnetostrictive element for penetration thereof in a direction perpendicular to the longitudinal axis thereof; generating the AC current at a frequency effecting said penetration of the magnetostrictive element to a predetermined skin depth; and said magnetostrictive element having a piezomagnetic property selected for maximizing said change in electrical impedance measured as a result of the stress applied.

* * * * *